(12) United States Patent
Schelling

(10) Patent No.: US 12,297,541 B2
(45) Date of Patent: May 13, 2025

(54) METHOD FOR PRODUCING A NANOSCALE CHANNEL STRUCTURE

(71) Applicant: Robert Bosch GmbH, Stuttgart (DE)

(72) Inventor: Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 374 days.

(21) Appl. No.: 17/800,611

(22) PCT Filed: Feb. 15, 2021

(86) PCT No.: PCT/EP2021/053619
§ 371 (c)(1),
(2) Date: Aug. 18, 2022

(87) PCT Pub. No.: WO2021/165191
PCT Pub. Date: Aug. 26, 2021

(65) Prior Publication Data
US 2023/0074834 A1    Mar. 9, 2023

(30) Foreign Application Priority Data
Feb. 21, 2020    (DE) ..................... 10 2020 202 262.3

(51) Int. Cl.
*C23C 16/56*    (2006.01)
*C23C 16/40*    (2006.01)
(Continued)

(52) U.S. Cl.
CPC .............. *C23C 16/56* (2013.01); *C23C 16/40* (2013.01); *C23C 16/50* (2013.01);
(Continued)

(58) Field of Classification Search
None
See application file for complete search history.

(56) References Cited

U.S. PATENT DOCUMENTS

2004/0077107 A1    4/2004    Vogeli
2007/0077107 A1    4/2007    Dochi et al.
(Continued)

FOREIGN PATENT DOCUMENTS

CN    106208610 A    12/2016
CN    106487163 A    3/2017
(Continued)

OTHER PUBLICATIONS

International Search Report corresponding to PCT Application No. PCT/EP2021/053619, mailed May 7, 2021 (German and English language document) (5 pages).
(Continued)

*Primary Examiner* — Roberts P Culbert
(74) *Attorney, Agent, or Firm* — Maginot, Moore & Beck LLP

(57) ABSTRACT

A method for producing a nanoscale channel structure disclosed. The method includes depositing and structuring a first sacrificial layer on a substrate, depositing a second sacrificial layer on the substrate and on the first sacrificial layer, depositing an etching masking layer on the second sacrificial layer, partly removing the etching masking layer and the second sacrificial layer, removing the first sacrificial layer and additionally partly removing the second sacrificial layer, depositing a wall layer on the etching masking layer and on the substrate, structuring access openings to the second sacrificial layer, and removing the remaining second sacrificial layer.

11 Claims, 4 Drawing Sheets

(51) Int. Cl.
    *C23C 16/50*     (2006.01)
    *G01N 27/414*     (2006.01)

(52) U.S. Cl.
    CPC ..... *G01N 27/4141* (2013.01); *G01N 27/4145* (2013.01); *G01N 27/4146* (2013.01)

(56) References Cited

U.S. PATENT DOCUMENTS

| | | | |
|---|---|---|---|
| 2007/0138881 A1 | 6/2007 | Ichizaki | |
| 2008/0190171 A1 | 8/2008 | Higashi | |
| 2010/0072864 A1 | 3/2010 | Nguy et al. | |
| 2020/0075599 A1* | 3/2020 | Hashemi | H01L 29/42392 |

FOREIGN PATENT DOCUMENTS

| | | | |
|---|---|---|---|
| DE | 20 2017 107 858 U1 | 7/2018 | |
| EP | 3 142 226 A1 | 3/2017 | |
| JP | 2019-68610 A | 4/2019 | |
| WO | 2011/078650 A2 | 6/2011 | |
| WO | 2018/210561 A1 | 11/2018 | |

OTHER PUBLICATIONS

Tas, N. et al., "2D-Confined Nanochannels Fabricated by Conventional Micromachining", Nano Letters, vol. 2, No. 9, pp. 1031-1032, Jul. 2002, American Chemical Society.

Lee, C. et al., "A Nanochannel Fabrication Technique without Nanolithography", Nano Letters, vol. 3, No. 10, pp. 1339-1340, Jun. 2003, American Chemical Society.

Duan, C. et al., "Review article: Fabrication of nanofluidic devices", Biomicrofluidics 7, 2013, 41 pages, American Institute of Physics.

Kleditzsch, S. et al., "Steel-aluminum knurled interference fits: joining process and load characteristics", Procedia Engineering, vol. 81, Oct. 2014, pp. 1982-1987, Elsevier Ltd.

* cited by examiner

METHOD FOR PRODUCING A NANOSCALE CHANNEL STRUCTURE

This application is a 35 U.S.C. § 371 National Stage Application of PCT/EP2021/053619, filed on Feb. 15, 2021, which claims the benefit of priority to Serial No. DE 10 2020 202 262.3, filed on Feb. 21, 2020 in Germany, the disclosures of which are incorporated herein by reference in their entirety.

The present disclosure relates to a method for producing a nanoscale channel structure. The present disclosure furthermore relates to a computer program that performs each step of the method, and to a machine-readable storage medium which stores the computer program. Finally, the disclosure relates to an electronic control unit configured to perform the method.

BACKGROUND

Nanoscale channels are needed for microfluidic applications. For example, nanochannels are used for genome sequencers in order to guide DNA strands as closely as possible past readout electrodes and to decode them at the same time. In gas chromatography, nanochannels are advantageous when separating gas species due to their high surface-area-to-volume ratio, since the separation occurs by way of the specific wall interaction. In both cases, the precise geometry of the nanochannel is particularly important. However, conventional methods for producing nanoscale channel structures lead to channel geometries that are not highly reproducible. This is because either the methods use time-dependent etches or underetches, or the already-open channel is closed by way of layer deposition, with the walls of the channel being partially concomitantly coated. Some methods are also subject to strict geometric restrictions. Rounded portions in a coating also adversely affect the production of nanoscale channel structures.

DE 20 2017 107 858 U1 relates to a device for a protein corona sensor array for early detection of diseases. Herein, a sample can be conducted over a sensor array through a nanochannel. The channels can be formed by means of sacrificial layer etching. This uses lithographic techniques in order to structure a material on a substrate. This material is covered by another material of a different chemical nature. It may be subjected to lithography processes and etching processes or other machining processes. The substrate is then exposed to a chemical agent that selectively removes the first material. Channels are formed in the second material, leaving voids where the first material was present before the etching process. Since the geometries of the channel are determined by way of lithography, they also cannot be produced in a highly reproducible manner in this method.

SUMMARY

The method for producing a nanoscale channel structure comprises at least eight method steps (a to h):

In a first method step (step a), a first sacrificial layer is deposited and structured on a substrate. Here, the substrate may both be a bulk material and have a layer substructure onto which the first sacrificial layer is deposited. This first sacrificial layer may also be referred to as "gate layer". Suitable deposition methods are, in particular, low-pressure chemical vapor deposition (LPCVD), plasma-enhanced chemical vapor deposition (PECVD) or atomic layer deposition (ALD). Suitable materials of the first sacrificial layer are, in particular, silicon or silicon nitride. A first sacrificial layer of polycrystalline silicon is preferably deposited by means of LPCVD or ALD and a first sacrificial layer of silicon nitride is preferably deposited by means of PECVD. "Structuring" is understood to mean that the first sacrificial layer is completely removed regionally so that the substrate is exposed again. The edges between the structured first sacrificial layer and the regions of the substrate freed of the first sacrificial layer define the course of the nanoscale channel structure.

In a second method step (step b), a second sacrificial layer is deposited on the substrate and on the first sacrificial layer. The second sacrificial layer may also be referred to as "channel layer". The thickness of the second sacrificial layer defines the height of the nanoscale channels. Said second sacrificial layer is therefore deposited preferably with a thickness of less than 100 nm and particularly preferably with a thickness of less than 10 nm. The same methods as for the deposition of the first sacrificial layer are preferred for the deposition of the second sacrificial layer. Furthermore, the same materials as for the deposition of the first sacrificial layer are also preferred for the deposition of the second sacrificial layer. Particularly preferably, the first sacrificial layer and the second sacrificial layer are deposited from the same material. This enables later removal of the first sacrificial layer and of the second sacrificial layer by means of the same method.

In a third method step (step c), an etch masking layer is deposited on the second sacrificial layer. The etch masking layer may also be referred to as "spacer layer". Said etch masking layer may optionally be structured after it has been deposited. Suitable deposition methods are, in particular, PECVD or ALD. Suitable materials of the etch masking layer are, in particular, oxides. The thickness of the etch masking layer defines the width of the nanoscale channels. Said etch masking layer is therefore deposited with a thickness of preferably at least 1 nm. Its maximum thickness is preferably less than 100 nm, particularly preferably less than 20 nm. This achieves an advantageous width for the nanoscale channel structure. Furthermore, the thickness of the etch masking layer is preferably less than the thickness of the first sacrificial layer. Particularly preferably, it is less than the thickness of the first sacrificial layer at least by a factor of 3. Very particularly preferably, it is less than the thickness of the first sacrificial layer at least by a factor of 30. This ensures that the mesa structure consisting of the first sacrificial layer and second sacrificial layer is coated in a particularly conformal manner without rounded portions.

In a fourth method step (step d), the etch masking layer and the second sacrificial layer are partially removed. A suitable method for partially removing the etch masking layer and the second sacrificial layer is anisotropic etching, such as, in particular, reactive-ion etching (RIE). When etchback of the etch masking layer applied to the first sacrificial layer and of the second sacrificial layer applied to the first sacrificial layer is effected in this method step, the second sacrificial layer applied to the substrate and the etch masking layer applied thereto are also predominately etched back. It is only at the location where the lateral faces of the first sacrificial layer are covered by the second sacrificial layer and the etch masking layer that the second sacrificial layer and the etch masking layer are not completely etched back.

In a fifth method step (step e), the first sacrificial layer is removed and the second sacrificial layer is further partially removed. This can preferably be effected by means of the same method as the removal of the layers in step d, particularly if the first sacrificial layer and the second sacrificial layer consist of the same material. As a result, what remain are only a residue of the second sacrificial layer in the width of the planned nanoscale channel structure and a residue of the etch masking layer on the top thereof. The etch masking layer here protects the underlying second sacrificial layer in a width that corresponds to the thickness of the etch masking layer and hence the width of the planned channel structure.

In a sixth method step (step f), a wall layer is deposited on the etch masking layer and on the substrate. This wall layer, that may also be referred to as "confinement layer", forms the walls of the nanoscale channel structure. Said wall layer is preferably deposited from the same material as the etch masking layer. This makes it possible to merge the remaining residues of the etch masking layer and the wall layer to form a structure that consists of the same material.

In a seventh method step (step g), access openings to the second sacrificial layer are structured. This can be effected by way of structuring of the wall layer.

In an eighth method step (step h), the remaining second sacrificial layer in the channel region is removed. This can be effected in particular by way of isotropic etching for example using xenon difluoride ($XeF_2$) or using sulfur hexafluoride ($SF_6$). These substances can be brought into contact with the second sacrificial layer through the access openings structured in step g.

In this way, a nanoscale channel structure is obtained that is accessible through the access openings in the wall layer. Since the height of the channels is defined by the thickness of the second sacrificial layer and the width of the channels is defined by the thickness of the etch masking layer, and since the layer thicknesses can be set with very high accuracy during deposition, the method makes it possible for nanoscale channel structures to be produced in a manner that is very highly reproducible and is suitable for mass production.

The computer program is configured to carry out each step of the method when it is run on a computer or electronic control unit. To this end, the computer or electronic control unit can control devices that carry out deposition, structuring and removal steps of the method. The computer program makes it possible for different embodiments of the method to be implemented on a control unit of a device for producing nanoscale channel structures, without structural modifications having to be made thereto. To this end, said computer program is stored on the machine-readable storage medium.

Installing the computer program on a conventional electronic control unit gives the electronic control unit which is configured to produce a nanoscale channel structure by means of the method, when said electronic control unit controls a suitable production device for this purpose.

BRIEF DESCRIPTION OF THE DRAWINGS

An exemplary embodiment of the disclosure is illustrated in the drawings and will be explained in more detail in the following description.

DETAILED DESCRIPTION

Figure 1:
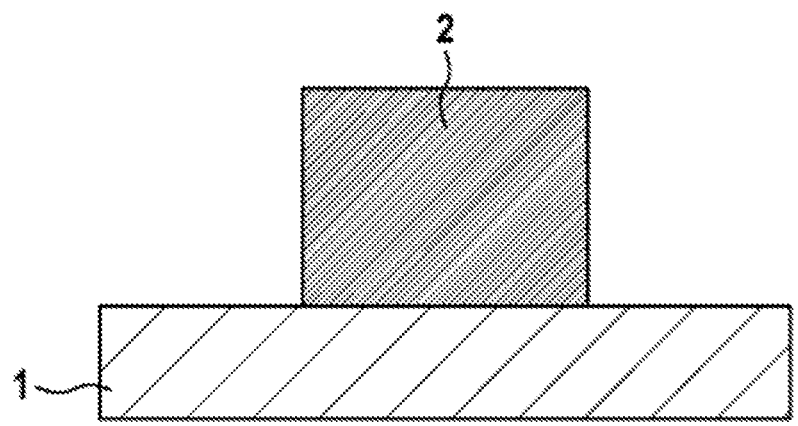
FIG. 1 shows a cross-sectional view of a substrate, on which a first sacrificial layer has been deposited and structured.

In one exemplary embodiment of the disclosure, a first sacrificial layer 2 of polysilicon with a thickness of 150 nm is deposited on a substrate 1. Said layer is structured such that the substrate 1 is partially exposed again. This is illustrated in FIG. 1.

A second sacrificial layer 3, likewise consisting of polysilicon, is then deposited by means of LPCVD such that it covers, with a thickness of 5 nm, the exposed surface of the substrate 1, the surface of the first sacrificial layer 2 and the lateral faces of the first sacrificial layer 2.

Figure 2:
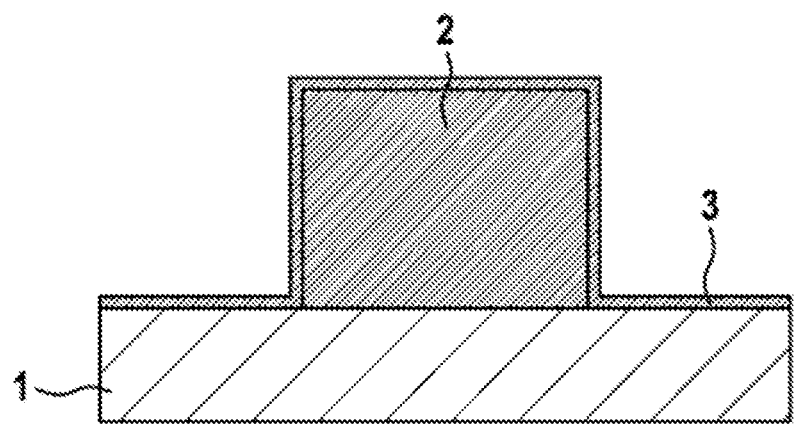
FIG. 2 shows a cross-sectional view of the substrate according to FIG. 1, after a second sacrificial layer has been deposited on the substrate and the first sacrificial layer.

Since the first sacrificial layer 2 and the second sacrificial layer 3 consist of the same material, they merge with one another, as illustrated in FIG. 2.

Figure 3:
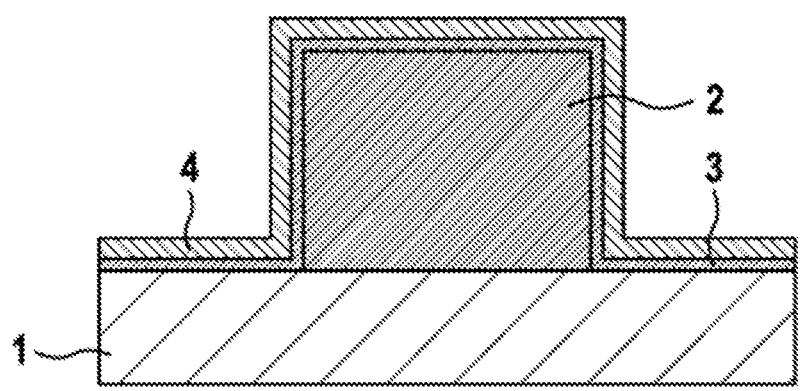
FIG. 3 shows a cross-sectional view of the substrate according to FIG. 2, after an etch masking layer has been deposited on the second sacrificial layer.

As illustrated in FIG. 3, an oxide layer is subsequently deposited, for example by means of PECVD, as an etch masking layer 4 such that it covers, with a thickness of 10 nm, the surface and lateral faces of the 5 nm-thick second sacrificial layer 3.

Figure 4:
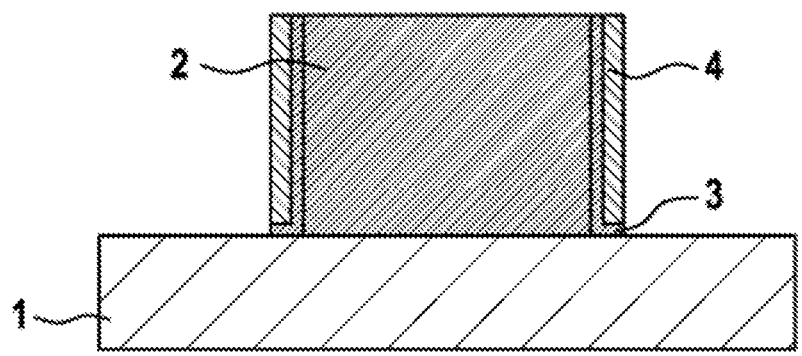
FIG. 4 shows a cross-sectional view of the substrate according to FIG. 3, after the etch masking layer and the second sacrificial layer have been partially removed.

Anisotropic RIE etching is subsequently effected as etchback until the substrate 1 is partially exposed again. This means that in the regions that are not covered by the first sacrificial layer 2, the etch masking layer 4 and the underlying second sacrificial layer 3 are completely removed. The layer structure consisting of the second sacrificial layer 3 and the etch masking layer 4 that is applied on top of the first sacrificial layer 2 is also removed. The parts of the etch masking layer 4 which cover the sides of the first sacrificial layer 2 are not removed, since the anisotropic etching is only effected from top to bottom. These remaining parts of the etch masking layer 4 can therefore protect the underlying part of the second sacrificial layer 3 from etchback. The parts of the second sacrificial layer 3 that are arranged between the first sacrificial layer 2 and the etch masking layer 4 are not removed either. This is illustrated in FIG. 4.

Figure 5:
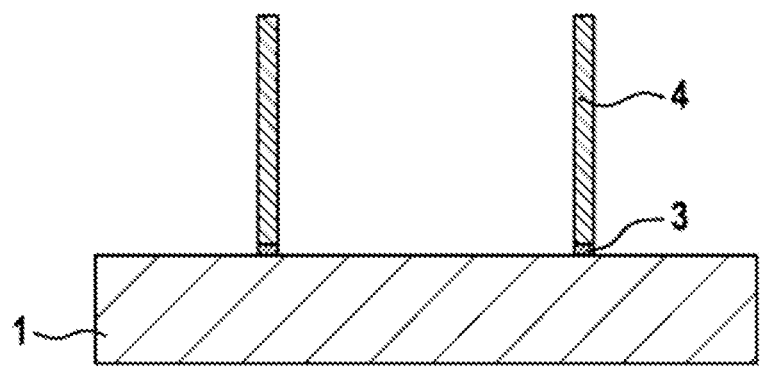
FIG. 5 shows a cross-sectional view of a substrate according to FIG. 4, after the first sacrificial layer has been removed.

The parameters of the RIE etching are then changed such that, in the remainder of the etching process, it is only the first sacrificial layer 2 and the second sacrificial layer 3 that are attacked, but no longer the etch masking layer 4. This completely removes the first sacrificial layer 2, with the residues of the etch masking layer 4 and the residues of the second sacrificial layer 3 protected by the latter, as shown in FIG. 5, remaining on the substrate 1.

Figure 6:
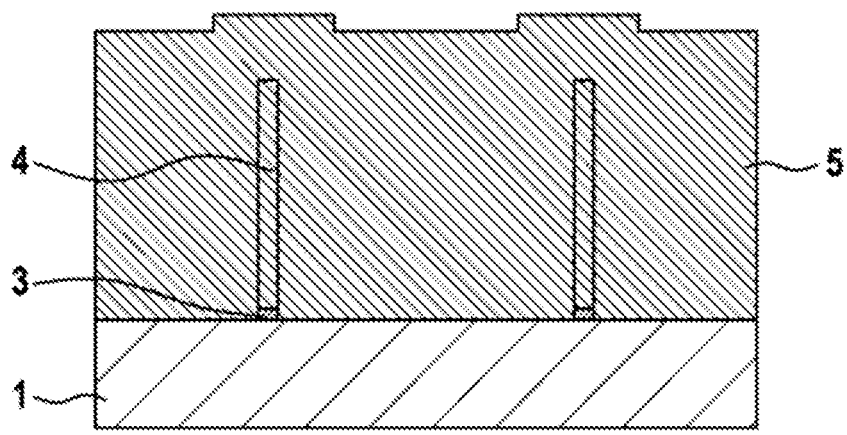
FIG. 6 shows a cross-sectional view of the substrate according to FIG. 5, after a wall layer has been deposited on the etch masking layer and on the substrate.
Figure 7:
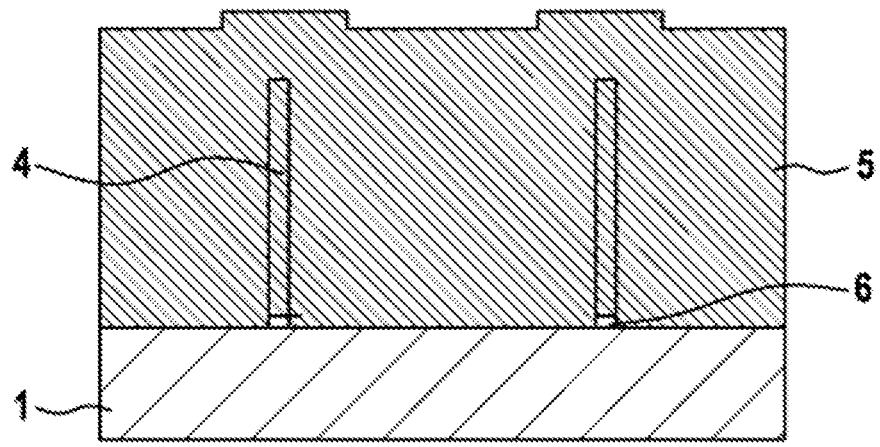
FIG. 7 shows a cross-sectional view of the substrate according to FIG. 6 after removal of the second sacrificial layer.

A wall layer 5, composed of an oxide for example, is then deposited by means of PECVD in a thickness of 200 nm. As illustrated in FIG. 6, this wall layer 5 merges with the residues of the etch masking layer 4, since these two layers consist of the same material. This results in projections on the wall layer 5 above the residues of the etch masking layer 4. FIG. 6 illustrates the layer structure that arises when these projections have already been partially smoothed by way of structuring, with the result that only an indication remains on the upper side of the wall layer 5 as to where the residues of the second sacrificial layer 3 are located and where the nanoscale channels will therefore run in the finished channel structure.

Access openings to the residues of the second sacrificial layer 3 are then structured and $XeF_2$ is introduced through said access openings until the residues of the second sacrificial layer 3 are completely removed by way of isotropic etching. As a result, nanoscale channels 6 are left at the location at which the residues of the second sacrificial layer 3 were previously located. Said nanoscale channels are accessible through the access openings. The width of the nanoscale channels corresponds to the former thickness of the etch masking layer 4, and thus 10 nm. The height of the nanoscale channels corresponds to the former thickness of the second sacrificial layer, and thus 5 nm. The nanoscale channel structure obtained in this way can for example be used for a DNA sequencer or for a gas sensor.

The invention claimed is:

1. A method for producing a nanoscale channel structure, comprising:
   depositing and structuring a first sacrificial layer on a substrate;
   depositing a second sacrificial layer on the substrate and on the first sacrificial layer;
   depositing an etch masking layer on the second sacrificial layer;
   partially removing the etch masking layer and a first portion of the second sacrificial layer;
   after partially removing the etch masking layer and the first portion, removing the first sacrificial layer and further partially removing a second portion of the second sacrificial layer;
   depositing a wall layer on the partially removed etch masking layer and on the substrate;
   structuring access openings to access the remaining portion of the second sacrificial layer; and
   removing the remaining portion of the second sacrificial layer.

2. The method as claimed in claim 1, wherein the second sacrificial layer is deposited with a thickness of less than 100 nm.

3. The method as claimed in claim 1, wherein the first sacrificial layer and the second sacrificial layer are deposited from the same material.

4. The method as claimed in claim 1, wherein the etch masking layer is deposited with a smaller thickness than the first sacrificial layer.

5. The method as claimed in claim 1, wherein the partial removal of the etch masking layer and of the first portion of the second sacrificial layer and also the removal of the first sacrificial layer and the further partial removal of the second portion of the second sacrificial layer are effected by way of anisotropic etching.

6. The method as claimed in claim 1, wherein the wall layer is deposited from the same material as the etch masking layer.

7. The method as claimed in claim 1, wherein the removal of the remaining portion of the second sacrificial layer is effected by way of isotropic etching.

8. A computer program configured to carry out each step of the method as claimed in claim 1.

9. A machine-readable storage medium on which a computer program as claimed in claim 8 is stored.

10. An electronic control unit configured to produce a nanoscale channel structure by way of a method as claimed in claim 1.

11. The method of claim 1, wherein the access openings are structured in the wall layer.

\* \* \* \* \*